(12) United States Patent
Cariello et al.

(10) Patent No.: US 12,386,562 B2
(45) Date of Patent: *Aug. 12, 2025

(54) DYNAMIC STATUS REGISTERS ARRAY

(71) Applicant: Micron Technology, Inc., Boise, ID (US)

(72) Inventors: Giuseppe Cariello, Boise, ID (US); Reshmi Basu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/633,028

(22) Filed: Apr. 11, 2024

(65) Prior Publication Data

US 2024/0345775 A1 Oct. 17, 2024

Related U.S. Application Data

(63) Continuation of application No. 17/399,889, filed on Aug. 11, 2021, now Pat. No. 11,972,144.

(51) Int. Cl.
*G06F 3/06* (2006.01)

(52) U.S. Cl.
CPC ............ *G06F 3/0659* (2013.01); *G06F 3/061* (2013.01); *G06F 3/0679* (2013.01)

(58) Field of Classification Search
CPC ...... G06F 3/061; G06F 3/0659; G06F 3/0679; G11C 16/0483; G11C 16/08
See application file for complete search history.

(56) References Cited

U.S. PATENT DOCUMENTS

2018/0349240 A1* 12/2018 Ji ..................... G06F 11/1441
2019/0227749 A1 7/2019 Wakchaure et al.
2021/0117335 A1 4/2021 Kondo

* cited by examiner

*Primary Examiner* — Larry T Mackall
(74) *Attorney, Agent, or Firm* — Holland & Hart LLP

(57) ABSTRACT

Methods, systems, and devices for dynamic status registers array are described. An apparatus may include one or more memory dice coupled with a data bus. The apparatus may further include a controller coupled with each of the memory dice via the data bus that is configured to transmit a first command associated with a first operation to a first memory die. The first command may assign an associated operation (e.g., the first operation) to a queue slot of a status bank that is associated with at least the first memory die. The controller may further transmit second command to the first memory die to request a status of the first operation. The controller may receive a status of the first operation via a channel (e.g., a first channel) of the data bus that is based on the assigned queue slot of the status bank.

18 Claims, 8 Drawing Sheets

200

DYNAMIC STATUS REGISTERS ARRAY

CROSS REFERENCE

The present Application for Patent is a continuation of U.S. patent application Ser. No. 17/399,889 by Cariello et al., entitled "DYNAMIC STATUS REGISTERS ARRAY," filed Aug. 11, 2021, assigned to the assignee hereof, and is expressly incorporated by reference in its entirety herein.

FIELD OF TECHNOLOGY

The following relates generally to one or more systems for memory and more specifically to dynamic status registers array.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
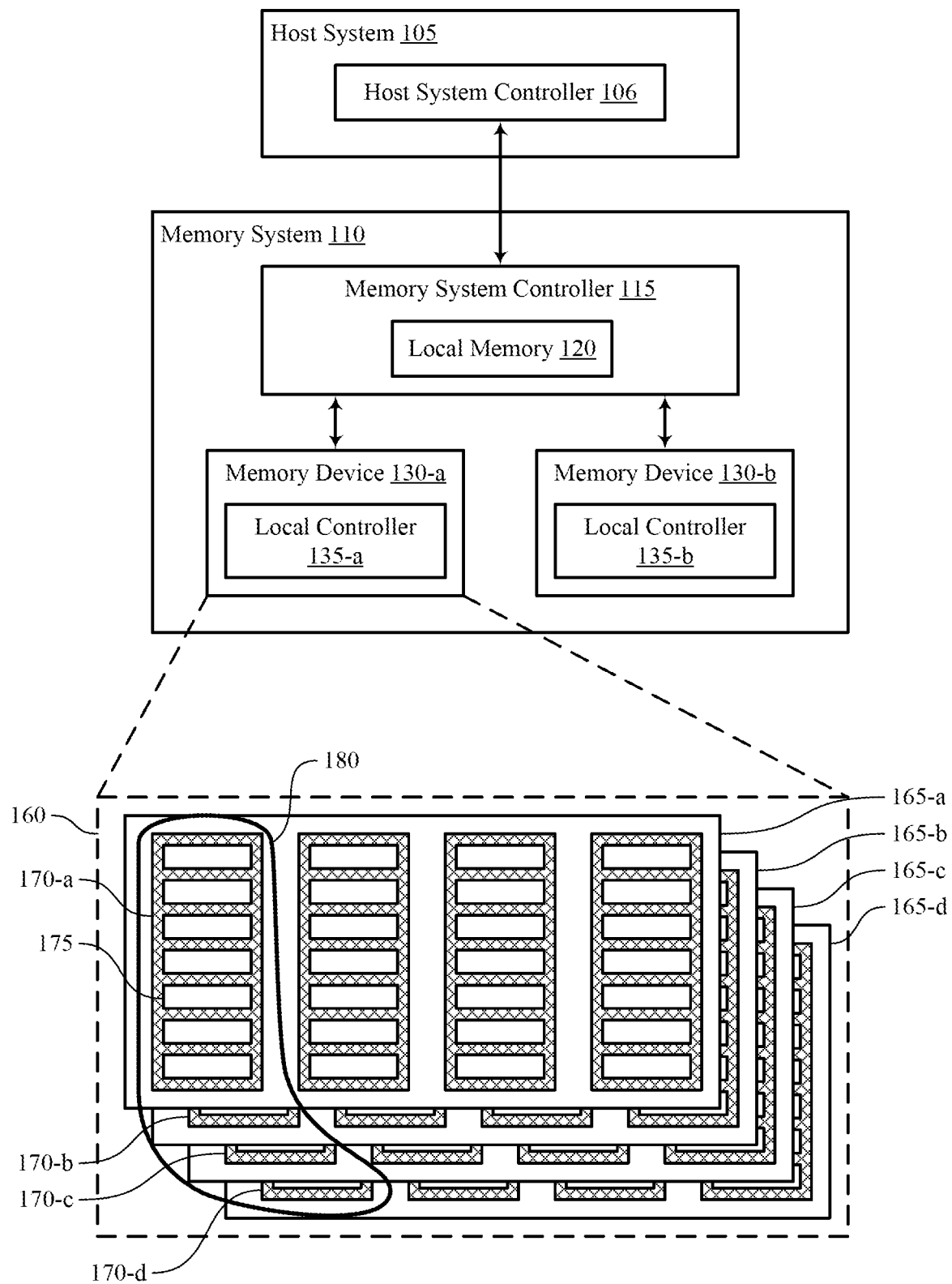
FIG. 1 illustrates an example of a system that supports dynamic status registers array in accordance with examples as disclosed herein.

A system may include a host system and a memory system that stores data for the host system. In some examples, the memory system may include multiple memory devices attached to an interface. For example, the memory system may include multiple NAND devices attached to the same interface (e.g., Open NAND Flash Interface (ONFI) channel). The host system may transmit access commands (e.g., read commands, program commands, erase commands) to the memory system. In such examples, the memory system may execute operations in response to the commands received from the host system. In examples where multiple memory devices are included in the memory system, the memory devices may perform concurrent operations—e.g., operations that may not be initiated at the same time but proceed in parallel. That is, the memory system may initiate a first operation at a first memory device, then a second operation at a second memory device, then a third operation at a third memory device, and the first, second, and third operations may be executed at least partially in parallel. In some examples, the host system controller or memory system controller may execute round robin polling of the status register of each active memory device to determine if a given memory device is ready to be serviced—e.g., the controller may poll the first memory device, then the second memory device, and then the third memory device, to determine if the first, second, or third memory device is ready to be serviced. In some examples, performing round robin polling may increase latency and power consumption in the system. For example, the second memory device may be ready to be serviced before the first memory device but may wait idly until the system is done polling the status register of the first memory device. Also switching from one memory device to another memory device to poll the memory devices in the round robin polling may utilize additional power consumption for the bus transitions. And finally, a memory device idly waiting for a subsequent command may increase power consumption as well.

Systems, techniques, and devices are described herein to perform concurrent or parallel status polling via a dedicated command in a memory system with multiple memory devices. For example, a controller in the memory system may transmit commands to multiple memory devices to assign each operation to a queue slot of a status bank. Accordingly, the controller may subsequently poll a status bank using a command (e.g., a bank selection polling command) and devices with operations assigned to queue slots of the status bank may output the status on channels of a data bus that are associated with the queue slots for the status bank. For example, for an eight (8) bit data bus coupled with a memory device having eight (8) banks, the polling status of 256 concurrent operations may be supported. By performing concurrent parallel status polling utilizing status banks, the memory system may decrease power consumption and latency. That is, the polling based on status banks may assist in identifying which memory devices are ready to be serviced first, and thus enable faster servicing of the commands of the given memory devices. This may reduce a quantity of time each memory device waits idly for servicing or subsequent commands, reducing power consumption and latency of the system.

Figure 2:
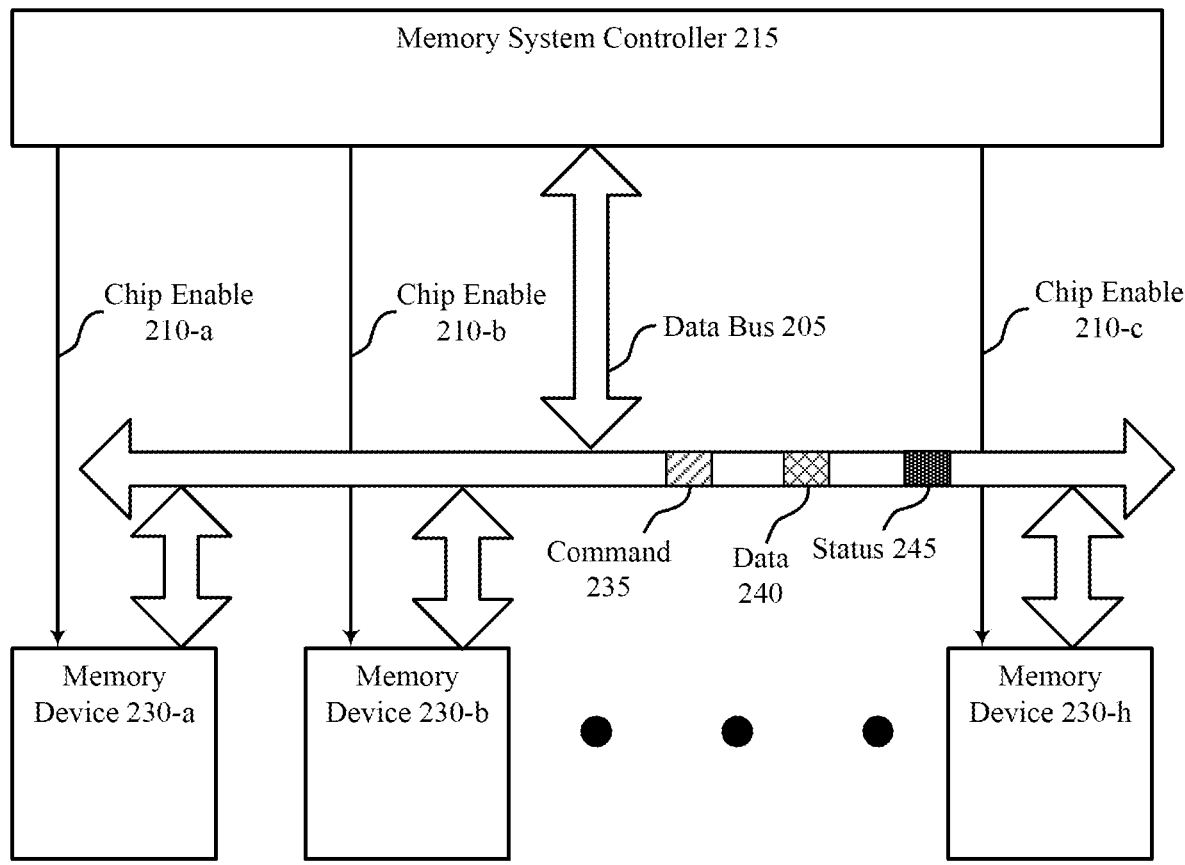
FIG. 2 illustrates an example of a system that supports dynamic status registers array in accordance with examples as disclosed herein.

Features of the disclosure are initially described in the context of systems and devices with reference to FIGS. 1 and 2. Features of the disclosure are described in the context of block diagrams and timing diagrams with reference to FIGS. 3 and 4. These and other features of the disclosure are further illustrated by and described in the context of an apparatus diagram and flowchart that relate to dynamic status registers array with reference to FIGS. 5-8.

FIG. 1 illustrates an example of a system 100 that supports dynamic status registers array in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support reduced pin status register. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, memory system controller 115 may perform polling operations on the memory devices 130 to determine a status of the operations being performed by each memory device 130. In some cases, the memory system controller 115 may conduct the polling operation in a round robin system. For example, the memory system controller 115 may first request a status of a first operation being executed at the memory device 130-a and then request a status of a second operation being executed at the memory device 130-b. In some cases, the second operation may be executed before the first operation. In such examples, the memory device 130-b may idly wait for the memory system controller 115 to request the status of the second operation. The idle wait period may increase the power consumption and latency of the system.

As described herein, the memory system controller 115 may perform a concurrent polling operation on the memory devices 130 by utilizing one or more banks (e.g., status banks). For example, the memory system controller 115 may transmit a command (e.g., a first command) to the memory device 130-a. The command may assign an operation (e.g., a first operation) to a queue slot of a status bank associated with the memory device 130-a. In some instances, the memory system controller 115 may transmit multiple commands to one or more of the memory devices 130 to assign operations to queue slots of respective status banks. Subsequently, the memory system controller 115 may transmit a command (e.g., a second command, a polling command) to multiple memory devices 130 that requests a status associated with the status bank. The memory device 130-a may output the status of the operation, such that if memory device 130-a is ready to be serviced then the memory system controller 115 may proceed to service the memory device 130-a. Accordingly, the association between the operation, the queue slot of the status bank, and the channel of the bus may allow the memory system controller 115 to service the first memory device 130 of the status bank that is ready for service, thus reducing the idle time and decreasing the latency and power consumption of the system.

FIG. 2 illustrates an example of a system 200 that supports dynamic status registers array in accordance with examples as disclosed herein. System 200 may be an example of a memory system 110 as described with reference to FIG. 1. System 200 may include a memory system controller 215 and memory devices 230 which may be examples of memory system controller 115 and memory devices 130 as described with reference to FIG. 1. The memory system controller 215 may be coupled with the memory devices 230 via a data bus 205. The memory system controller 215 may also be coupled with each memory device 230 via a chip enable line 210—e.g., memory device 230-a may be coupled with the memory system controller 215 via chip enable line 210-a. In some examples, there may be eight (8) memory devices 230 coupled with memory system controller 215. In other examples, there may be more than or less than eight (8) memory devices 230 coupled with the memory system controller 215. It should be noted, a quantity of memory devices 230 in the system 200 are not limiting on the claims.

As described with reference to FIG. 1, memory system controller 215 may be configured to communicate commands from a host system (e.g., host system 105) to memory devices 230. In some examples, the memory system controller 215 may be configured to transmit a command 235 to the memory devices 230 via the data bus 205. In such examples, the memory system controller 215 may be configured to activate a memory device 230-a via a chip enable line 210 to transmit the command 235 from the memory system controller 215 to a given memory device 230. For example, the memory system controller 215 may activate memory device 230-a via chip enable line 210-a and then transmit a command 235 to initiate an operation to the memory device 230-a. In some examples, the memory system controller 215 may be configured to transmit commands 235 to initiate concurrent operations—e.g., operations that may not be initiated at the same time but proceed in parallel. For example, the memory system controller 215 may be configured to activate memory device 230-a by transmitting a chip enable signal via the chip enable line 210-a. The memory system controller 215 may then transmit a command 235 to the memory device 230-a to initiate a first operation. The memory system controller 215 may then activate memory device 230-b via the chip enable line 210-b and transmit a second command 235 to the memory device 230-b to initiate a second operation. In such examples, the first operation and the second operations may be performed concurrently (e.g., in parallel) by the memory device 230-a and the memory device 230-b.

In some examples, the memory system controller 215 may be configured to communicate data 240 to and from the memory devices 230. For example, the memory system controller 215 may transmit data 240 to the memory devices 230 during a program command and receive data 240 from the memory devices 230 during a read command. The memory system controller 215 may also be configured to receive a status 245 from each memory device 230—e.g., the status 245 may indicate the status of a given operation being performed at a given memory device 230 and whether the given memory device 230 is ready to be serviced. As described with reference to FIG. 1, the memory devices 230 may associate commands with one or more status banks that each have one or more queue slots. The memory system controller 215 may transmit a command to a memory device 230 that assigns an operation (e.g., a first operation) to a queue slot, and the queue slot may be associated with an address channel or a data channel of the data bus 205 for a status bank. Accordingly, during a polling operation, the memory system controller 215 may determine the status of the memory device 230 (or a portion, e.g., a plane, of the memory device 230) based on the assigned queue slot and associated channel of the data bus 205.

Data bus 205 may be configured to communicate signals, commands 235, data 240, and statuses 245 between the memory system controller 215 and the memory devices 230—e.g., the data bus 205 may be a multiplexed (e.g., tri-state, bi-directional) bus configured to communicate both addresses and data 240. In some examples, the data bus 205 may be configured to have a quantity of bits equal to a quantity of data input/output (DQ) pins of the memory system controller 215. For example, the data bus 205 may be an eight (8) bit data bus 205 when the memory system controller 215 has eight (8) DQ pins. In some examples, the data bus 205 may also include a quantity of lines (e.g., channels) equal to the quantity of bits—e.g., each channel of the data bus 205 may be configured to communicate a bit of information. In some examples, the data bus 205 may also communicate a status 245 of each memory device 230 performing an operation concurrently. That is, the data bus 205 may be configured to multiplex the statuses 245 from the memory devices 230 to the memory system controller 215—e.g., a first status 245 from memory device 230-a may be communicated on a first line of the data bus 205 to the memory system controller 215 and a second status 245 from memory device 230-h may be concurrently communicated on a second line of the data bus 205 to the memory system controller 215. As described herein, which channel of the data bus 205 a status is communicated on may be based on an operation being assigned to an associated queue slot of a status bank.

Memory devices 230 may be configured to store data. In some examples, the memory devices 230 may be configured to receive commands 235 from the memory system controller 215. The memory devices 230 may be configured to concurrently perform operations in response to commands received from the memory system controller 215. Each memory device 230 may be configured to communicate data 240 to and from the memory system controller 215. In some examples, the memory devices 230 may also be configured to communicate a status 245 of an operation to the memory system controller 215. The status 245 may be a single bit indicating whether the memory device 230 is ready to be serviced—e.g., a status 245 of a given operation being performed at memory device 230. The memory devices 230 may be configured to access the data bus 205 based on the chip enable signal received from the memory system controller 215. For example, the memory device 230 may refrain from driving a status 245 or refrain from receiving a command 235 from the data bus 205 when the chip enable signal is in an inactivated (e.g., high) state. Alternatively, the memory device 230 may drive a status 245 or receive a command 235 from the data bus when the chip enable signal is in an activated (e.g., low) state—e.g., the memory system controller 215 may decouple the memory device 230 from the data bus 205 by driving the chip enable signal high. In some examples, each memory device 230 may include multiple independent sections (e.g., banks, partitions, planes). In some examples, a queue slot of a status bank may be configured to store a status associated with a particular bank, partition, plane, etc. of a memory device 230.

In some examples, the memory system controller 215 may receive a command from the host system. The memory system controller 215 may then activate a memory device 230 based on the command received from the host system—e.g., the memory system controller 215 may activate memory device 230-a, memory device 230-b, or memory device 230-h (e.g., via chip enable lines 210-a, 210-b, and 210-c respectively) based on the command received. After activating a memory device 230, the memory system controller 215 may transmit a command 235 to initiate an operation (e.g., a read, program, or erase operation) at the memory device 230. For example, the memory system controller may transmit a first command 235 to initiate an erase operation at memory device 230-a, a second command 235 to initiate a program operation at memory device 230-b, and a third command 235 to initiate a read operation at memory device 230-h. The memory system controller 215 may transmit the commands 235 sequentially (e.g., to memory device 230-a first and memory device 230-h last) while the operations may be performed concurrently at least in part. After each operation is initiated, the memory system controller 215 may perform a poll to determine a status of each operation and determine if the memory devices 230 are ready to be serviced.

In some examples, the memory system controller 215 may perform a round robin polling of a status register of each active memory device 230—e.g., each memory device 230 performing an operation. For example, the memory system controller 215 may deactivate the chip enable lines 210-b and 210-c to disconnect the data bus 205 from memory device 230-b and memory device 230-c while maintaining the chip enable line 210-a in an activated state. The memory system controller 215 may then transmit a command 235 to memory device 230-a to request a status 245 of the operation being performed at the memory device 230-a. The memory device 230-a may then transmit a status 245 utilizing the eight bits of data bus 205 to the memory system controller 215. The memory system controller 215 may then repeat the process to determine the status of the operations at memory devices 230-b and 230-h. In some examples, the memory device 230-h may complete its respective operation first. For example, the memory device 230-h may complete the read operation before the memory device 230-a completes the erase operation. That is, some operations may take a longer duration to perform than others—e.g., read operations may be performed in a first duration, program operations may be performed in a second duration, and erase operations may be performed in third duration, where the first duration is less than the second and third duration, and the second duration is less than the third duration. In such examples, the memory device 230-h may sit idly waiting for the memory system controller 215 to request the status 245 of the operation. This may increase the latency and power consumption of the system.

As described herein, the memory system controller 215 may perform a concurrent polling of the status register of each active memory device 230. For example, after assigning operations to respective queue slots of one or more status banks, the memory system controller 215 may transmit a command 235 to each of memory devices 230-a, 230-b, and 230-h (e.g., by activating each of chip enable lines 210-a, 210-b, and 210-h while transmitting the command) requesting the status of operations associated with a given status bank. The memory devices 230 having operations associated with queue slots of the given status bank may then drive a status 245 on respective channels the data bus 205. For example, the memory devices 230 may concurrently drive a status 245 on respective channels (e.g., address channels or data channels) that are based on the assigned queue slot of the associated operation. In such examples, the memory devices 230 may drive a first value to indicate the memory device 230 is busy and a second value to indicate the memory device 230 is ready to be serviced. Accordingly, the memory system controller 215 may determine which memory device 230 is ready to be serviced first and transmit subsequent commands 235 based on the determination. For example, the memory device 230-h may drive the second value on a first channel of the data bus 205 that is associated with a second queue slot of the status bank, which may indicate that the memory device 230-h is ready for service. The memory system controller 215 may then request the data 240 indicated by the read command from the memory device 230-h while the memory device 230-a and memory device 230-b may continue to execute their respective operations. By performing concurrent polling by assigning operations to queue slots of status banks, the memory system controller 215 may reduce latency and decrease extraneous power consumption.

Figure 3:
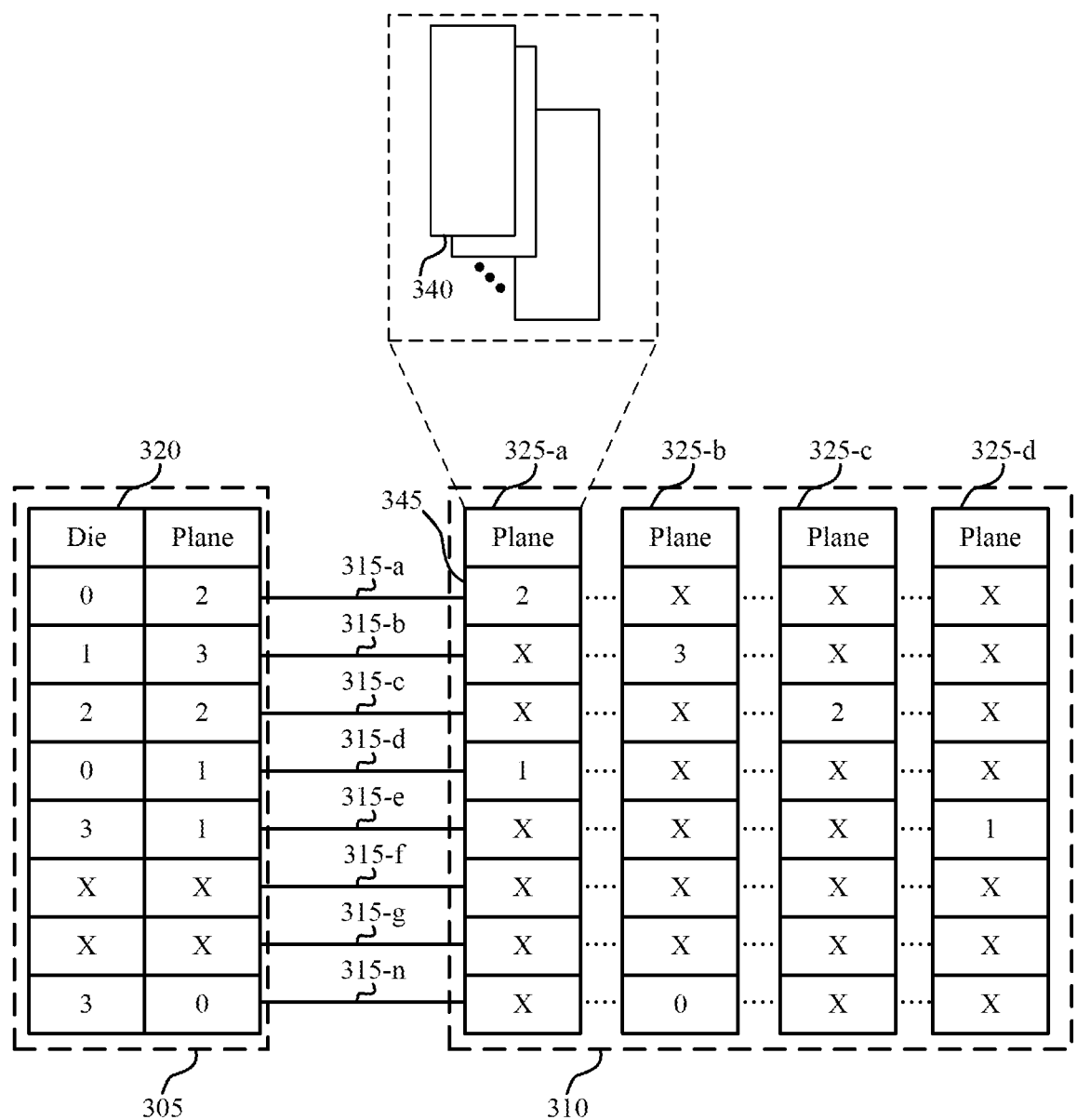
FIG. 3 illustrates an example of a block diagram that supports dynamic status registers array in accordance with examples as disclosed herein.

FIG. 3 illustrates an example of a block diagram 300 that supports dynamic status registers array in accordance with examples as disclosed herein. The block diagram 300 may illustrate a memory system controller 305 that is coupled with memory devices 310 via a plurality of channels 315 of a data bus. Memory system controller 305, memory devices 310, and the data bus may be examples of memory system controller 215, memory devices 230, and data bus 205 as described with reference to FIG. 2. In some examples, memory system controller 305 may store a mapping 320 (e.g., a table including mappings) between queue slots of a status bank of the memory devices 310 and planes of the memory devices 310, which may allow the memory system controller 305 to associate a received status with a particular memory device and plane. By performing polling operations as described herein, the memory system controller 305 may service the first memory device 310 that is ready for servicing, thus reducing the idle time and decreasing the latency and power consumption of the system.

As shown in FIG. 3, the memory devices 310 may include four (4) memory dice 325. For example, the memory devices 310 may include a first memory die 325-a, a second memory die 325-b, a third memory die 325-c, and a fourth memory die 325-d. Each memory die 325 may include any quantity of planes, where each plane may be configured for performing access operations independent of the other planes of the memory die 325. Moreover, although the queue slots 345 for one status bank are pictured in FIG. 3 for each memory die 325, each of the memory die 325 may include a plurality of status banks 340, and each status bank 340 may include a plurality of queue slots 345. For example, each memory die 325 may have a same quantity of queue slots 345 as the data bus has channels 315, and may have multiple status banks, each having the quantity of queue slots 345. As shown in FIG. 3, a first channel 315-a may be associated with a first queue slot, a second channel 315-b may be associated with a second queue slot, and an Nth channel 315-n may be associated with an Nth queue slot of the illustrated status bank. Thus, a system employing multiple memory dice 325 having eight (8) status banks, each status bank 340 having eight (8) queue slots 345 (e.g., corresponding to eight (8) channels 315 of a data bus), may support concurrent polling (by status bank) of 256 operations.

The memory system controller 305 may be configured to transmit a command (e.g., a first command) to the first memory die 325-a. The command may be associated with an operation (e.g., a read operation, a write operation, an erase operation) on a plane of the first memory die 325-a. For example, the first operation may be performed on plane 2 of the first memory die 325-a. The command may also include an assignment of the first operation to a queue slot of a status bank associated with the first memory die 325-a. As shown in FIG. 3, the first operation may be assigned to a queue slot of a first status bank of the memory device 310. The queue slot may be associated with a first channel 315-a (e.g., channel "0") of a data bus for the first status bank. In some instances, the assignment may be stored to a portion of the first memory die 325-a.

In some examples, additional operations may be performed on various planes of the memory dice 325. For example, an operation may be performed on plane 1 of the first memory die 325-a, and the operation may be assigned to a fourth queue slot of the first status bank of the memory die 325. Additionally or alternatively, operations may be performed on plane 3 and plane 0 of the second memory die 325-b, plane 2 of the third memory die 325-c and plane 1 of the fourth memory die 325-d. The operations may be assigned to queue slots of the first status bank of the memory die 325 as illustrated in FIG. 3.

The memory system controller 305 may store a mapping 320 between memory dice 325, planes (e.g., operations performed on planes), and channels 315 of the data bus. For example, the mapping 320 may indicate that an operation was performed on plane 2 of memory die 0 (e.g., memory die 325-a) that is associated with the first queue slot of the first status bank. Additionally or alternatively, the mapping 320 may not include any entries for queue slots of a status bank if no commands have been transmitted and assigned to the given queue slots. For example, no commands may have been transmitted to the memory dice 325 that are associated with the sixth or the seventh queue slots (e.g., associated with channels 315-f and 315-g, respectively) for the illustrated status bank, which is denoted by the mapping 320 indicating an "X" for the die and an "X" for the respective queue slots. However, if a command is transmitted with status associated with the sixth or the seventh queue slots for the status bank, the mapping 320 may be updated accordingly. In addition, although the mapping for memory system controller 305 is illustrated for one status bank, the mapping may include a quantity of status banks, each status bank having a quantity of queue slots (e.g., corresponding to the quantity of channels 315).

In some instances, the memory system controller 305 may transmit a command (e.g., a second command) requesting the status of one or more operations. For example, the second command may be transmitted to the first memory die 325-a, and a memory controller associated with the first memory die 325-a may generate status bit(s) and output the status bit(s) on the first channel 315-a and fourth channel 315-d of the data bus. As described herein, the status bit(s) may indicate whether the associated planes of memory die 325-a are ready to be serviced. In other examples, the second command may be transmitted to multiple memory die 325 concurrently, and each memory die 325 may output zero, one, or more than one status bits. For example, if the second command is transmitted to memory die 325-a, 325-b, 325-c, and 325-d and indicates to output status associated with the illustrated status bank, memory die 325-a may output the status for plane 2 on channel 315-a and plane 1 on channel 315-d, memory die 325-b may output the status for plane 3 on channel 315-b and plane 0 on channel 315-n, memory die 325-c may output the status for plane 2 on channel 315-c, and memory die 325-d may output the status for plane 1 on channel 315-c. Memory system controller 305 may thus perform concurrent polling of multiple operations across multiple memory die 325, and may service the first memory die 325 having an operation with its status assigned to the selected status bank that indicates it is ready for service. In addition, the memory system controller 305 may maintain multiple status banks, with each status bank able to support concurrent polling for one or more memory die 325. Once a memory die 325 is serviced, the associated portion of the mapping 320 stored to the memory system controller 305 and an associated mapping stored to the memory die 325 may be removed or replaced. For example, when plane 2 of the first memory die 325-a is serviced, the assignment of the plane to the queue slot of the status bank may be removed (e.g., changed to having an "X" value). Thus, a subsequent operation may be assigned to the first queue slot of the first status bank of the memory die 325-a, or for a different memory die 325.

By performing concurrent polling by assigning operations to queue slots of status banks, the memory system controller 305 may reduce latency and decrease extraneous power consumption. Moreover, the memory system controller 305 may be configured to manage polling operations for a relatively large quantity of operations in parallel.

Figure 4A:
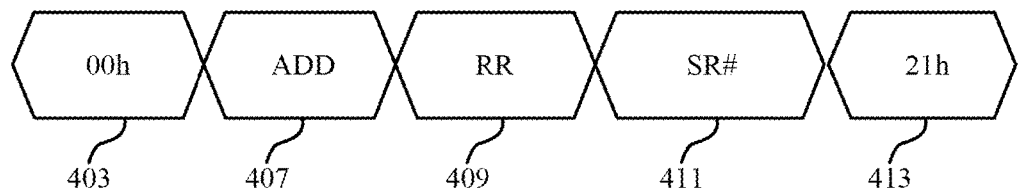
FIGS. 4A and 4B illustrate examples of timing diagrams that support dynamic status registers array in accordance with examples as disclosed herein.

FIG. 4A illustrates an example of a timing diagram 400-a that supports dynamic status registers array in accordance with examples as disclosed herein. The timing diagram 400-a may be performed by processing logic that may include hardware (e.g., processing system, circuitry, dedicated logic, programmable logic, microcode, hardware of a device, integrated circuit, etc.), software (e.g., instructions run or executed on a processing device), or a combination thereof. In some examples, the timing diagram 400-a may be performed by a system (e.g., system 200) as described with reference to FIG. 2. For example, the timing diagram may be performed by a memory system controller (e.g., memory system controller 215 as described with reference to FIG. 2) and memory devices (e.g., memory devices 230 as described with reference to FIG. 2). In some examples, the memory system controller may execute a set of codes to control the functional elements of the memory system to perform the functions described below. FIG. 4A may illustrate the system 100 communicating signals and commands (e.g., command 235, data 240, and status 245 as described with reference to FIG. 2) between a memory system controller and a memory device while conducting a concurrent polling operation.

FIG. 4A may illustrate a snap read command transmitted form a memory system controller to a memory device (e.g., a memory die of a memory device). The snap read command may be associated with an operation (e.g., a read operation) and may also assign the first operation to a queue slot of a status bank as described with reference to FIG. 3. In some instances, a snap read command may be transmitted to a memory device before a status operation is performed as described below with respect to FIG. 4B.

A snap read command may include a first field 403 (e.g., 00h), which may indicate a type of command (e.g., a memory command indicated by "00h"). In some instances, the first field 403 may be or may include an opcode for read commands. A second field 407 (e.g., ADD) may include a column and a row address, and a third field 409 (e.g., random read (RR)) may indicate the command for the snap read (e.g., random read) Additionally or alternatively, a snap read command may include a fourth field 411 (e.g., SR#), which may indicate a queue slot of a status bank (e.g., a status register) of the memory device to assign the associated operation to. For example, as described with reference to FIG. 3, the SR# may assign an operation associated with a plane associated with the command to a particular queue slot and status bank of the memory device. Accordingly, when a status operation is performed, a status bit may be output and the memory system controller may determine the plane and die associated with the status bit based on a mapping (e.g., a mapping 320 as described with reference to FIG. 3). Moreover, the snap read command may include a fifth field 413 (e.g., 21h), which may indicate that polling for the command will be via the status bank. In some instances, the fifth field 413 may specify a particular type of read to be performed. For example, the fifth field 413 may specify a 4 kB iWL read to be performed.

Figure 4B:
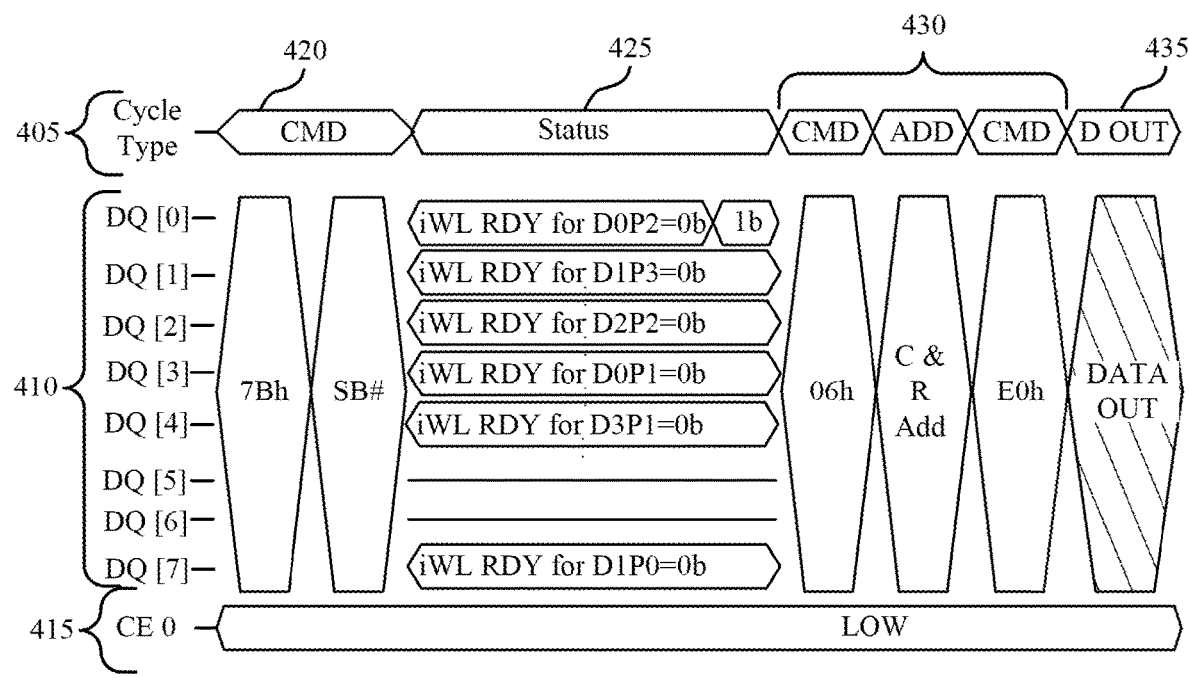

FIG. 4B illustrates an example of a timing diagram 400-*b* that supports dynamic status registers array in accordance with examples as disclosed herein. The timing diagram 400-*b* may be performed by processing logic that may include hardware (e.g., processing system, circuitry, dedicated logic, programmable logic, microcode, hardware of a device, integrated circuit, etc.), software (e.g., instructions run or executed on a processing device), or a combination thereof. In some examples, the timing diagram 400-*b* may be performed by a system (e.g., system 200) as described with reference to FIG. 2. For example, the timing diagram may be performed by a memory system controller (e.g., memory system controller 215 as described with reference to FIG. 2) and memory devices (e.g., memory devices 230 as described with reference to FIG. 2). In some examples, the memory system controller may execute a set of codes to control the functional elements of the memory system to perform the functions described below. FIG. 4A may illustrate the system 100 communicating signals and commands (e.g., command 235, data 240, and status 245 as described with reference to FIG. 2) between a memory system controller and a memory device while conducting a concurrent polling operation.

In some instances, the timing diagram 400-*b* may illustrate a polling operation performed after one or more commands (e.g., including the snap read command illustrated in FIG. 4A) have been issued. For example, multiple snap read commands may have been previously issued that resulted in assignments of operations as illustrated in FIG. 3.

In some examples, cycle type 405 may indicate the current cycle of the memory system controller or memory device—e.g., the type of signal communicated between the memory system controller and one or more memory devices via a data bus (e.g., data bus 205 as described with reference to FIG. 2). DQ pins may be examples of data lines 410 (e.g., channels 410) on the data bus and a quantity of DQ pins on the memory system controller. In examples where the data bus is an eight (8) bit data bus, the data bus may include eight (8) data lines—e.g., data lines 0-7. In some examples, a memory device may output a status on a given data bus line based on a snap read command (e.g., based on the SR# of a snap read command as described with reference to FIG. 4A). In examples where a memory device has multiple status banks, each queue slot may be associated with a dedicated channel of the data bus—e.g., memory device 230-*a* may be configured to output a first status associated with a first queue slot of a selected status bank on channel 0 (e.g., DQ0) and a second status associated with a second queue slot on channel 1 (e.g., DQ1).

In some cases, CE 415 may indicate a chip enable signal transmitted to a given memory device by a memory system controller via a chip enable line (e.g., chip enable line 210 as described with reference to FIG. 2). For example, CE 0 may indicate a chip enable signal driven to a first memory device. As described with reference to FIG. 2, the CE signals may be active-low polarity. That is, a chip enable signal on chip enable line 210 driven low may enable the memory device (e.g., coupling the data bus for commands, data input or output, or status output) and a chip enable signal driven high may disable the memory device (e.g., the memory device may decouple inputs and drivers from the data bus). Alternatively, the CE signals may operate in a similar way using active-high polarity.

At 420, a command may be transmitted. For example, a memory system controller may transmit a command (e.g., a second command) with the fields "7 Bh" and "SB#" to a memory device via a data bus. The memory system controller may transmit the command to request a status output from a particular status bank. For example, the SB# field may indicate the status bank selected to output status information from. As described herein, the memory system controller may have initiated an operation at the memory device based on issuing a snap read command as described above with reference to FIG. 4A, and the selected status bank may be configured as illustrated in FIG. 3.

At 425, a status of the devices under test (Dut) may be received. For example, a memory system controller may receive a status from the status bank indicated by the command 420. The status of the devices may be received concurrently on channels 0 through 7 according to the operations assigned to the queue slots of the selected status bank. For example, as described with reference to FIG. 3, the memory system controller may be configured to determine the memory die and plane associated with a status based on the mapping 320. In some examples, the memory device may transmit "0b," which may indicate that a plane or planes associated with the respective status bank is busy. For example, each channel 410 may be driven with "0b" until a plane associated with a status bank has completed an operation and is ready to be serviced. For example, the first channel 410 (e.g., DQ0) may be driven with "0b" until plane 2 of the first memory die 325-*a*, as described with reference to FIG. 3, has completed the operation and is ready for service. In such examples, the first channel 410 (e.g., DQ0) may then begin to drive a signal "1b" indicating plane 2 is ready to be serviced.

In addition, as described with reference to FIG. 3, status may be received from additional memory die having planes associated with queue slots for the selected status bank from the command 420. For example, at 425, channel DQ [1] may be driven according to the status of D1P3 (e.g., plane 3 of memory die 325-*b*), channel DQ [2] may be driven according to the status of D2P2 (e.g., plane 2 of memory die 325-*c*), channel DQ [3] may be driven according to the status of D0PI (e.g., plane 1 of memory die 325-*a*), channel DQ [4] may be driven according to the status of D3P1 (e.g., plane 1 of memory die 325-*d*), and channel DQ [7] may be driven according to the status of D1P0 (e.g., plane 0 of memory die 325-*b*), while channels DQ[5] and DQ [6] may not be associated with operations for any of the memory die 325 for the selected status bank, and may thus be left floating with drivers set to "Xb" (e.g., high impedance) by each of the memory die 325. Accordingly, at 425, any queue slot having been assigned an operation within the status bank selected by the command at 420 (e.g., by a snap read command) may output a status of the respective operation. As illustrated in FIG. 4B, plane 2 of the first memory die 325-*a* may be ready for service first of the operations associated with the selected status bank, and the memory system controller may detect that plane 2 of the first memory die 325-*a* has completed the operation and is ready for service.

At 430, another command may be transmitted. For example, the memory system controller may transmit the command to plane 2 of the first memory die 325-*a*, as described with reference to FIG. 3, based on plane 2 being ready to be serviced. In some examples, the memory system may transmit the command to request data from plane 2 of the first memory die 325-*a* associated with the completed operation. The command transmitted may indicate a type of command (e.g., read command indicated by "06h"), a column and row address (e.g., C & R Add), and additional information pertinent to the second command (e.g., "E0h"). For example, the memory system controller may indicate the read command is a single plane read, a multi-plane read, a single page read, a multi-page read, or a cache read after transmitting the second command (e.g., by transmitting "E0h").

At 435, data may be received. For example, the memory system controller may receive data from plane 2 of the first memory die 325-*a* in response to transmitting the command 430. In examples where the operation performed was a program operation, at step 435 the memory system controller may transmit data to plane 2 of the first memory die 325-*a*. In other examples, when the operation is an erase operation, at step 435 the memory die 325-*a* may transmit a response indicating the operation was completed to the memory system controller.

Subsequent to 435, a memory system controller may transmit additional snap read commands or commands (e.g., second commands) to request a status output from the same status bank (or a different status bank). For example, after reading the data from plane 2 of the first memory die, the memory system controller may transmit a second command to again request status output from the same status bank as shown in the command at 420. Thus the memory system controller may again perform concurrent polling associated with the status bank to determine if any additional planes or memory die are ready for servicing and perform additional servicing commands. By performing concurrent polling by assigning operations to queue slots of status banks, the memory system controller may reduce latency and decrease extraneous power consumption. Moreover, the memory system controller may be configured to manage polling operations for a relatively large quantity of operations in parallel.

Figure 5:
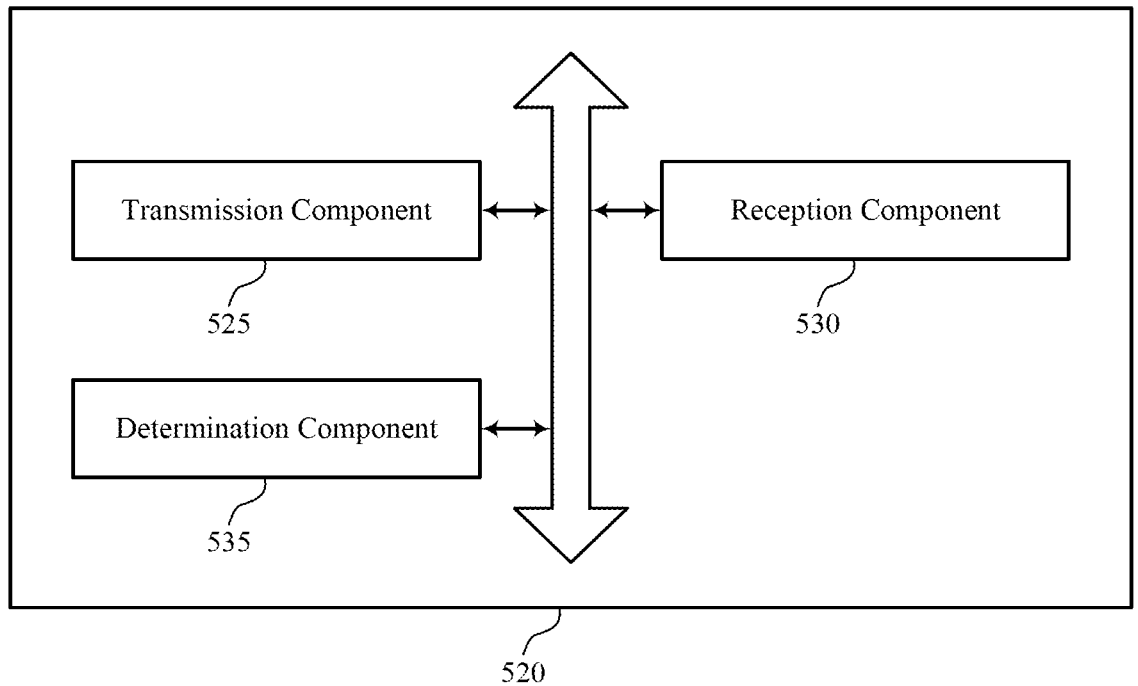
FIG. 5 shows a block diagram of a memory system controller that supports dynamic status registers array in accordance with examples as disclosed herein.

FIG. 5 shows a block diagram 500 of a memory system controller 520 that supports dynamic status registers array in accordance with examples as disclosed herein. The memory system controller 520 may be an example of aspects of a memory system controller as described with reference to FIGS. 1 through 4. The memory system controller 520, or various components thereof, may be an example of means for performing various aspects of dynamic status registers array as described herein. For example, the memory system controller 520 may include a transmission component 525, a reception component 530, a determination component 535, or any combination thereof. Each of these components may communicate, directly or indirectly, with one another (e.g., via one or more buses).

The transmission component 525 may be configured as or otherwise support a means for transmitting a first command associated with a first operation to a first memory die of a plurality of memory dice, where the first command includes an assignment of the first operation to a queue slot of a status bank. In some examples, the transmission component 525 may be configured as or otherwise support a means for transmitting a second command to the first memory die based at least in part on transmitting the first command, where the second command requests a status associated with the status bank.

In some examples, the transmission component 525 may be configured as or otherwise support a means for transmitting a third command associated with a second operation to a second memory die of the plurality of memory dice subsequent to transmitting the first command, where the third command includes an assignment of the second operation to a second queue slot of the status bank. In some examples, the transmission component 525 may be configured as or otherwise support a means for transmitting the second command concurrently to the first memory die and the second memory die based at least in part on transmitting the first command and the third command, where the second command is further configured to request the status associated with the status bank from the second memory die.

In some examples, the transmission component 525 may be configured as or otherwise support a means for transmitting a fourth command associated with a third operation to the first memory die of the plurality of memory dice based at least in part on receiving the indication of completion of the first operation, where the fourth command includes an assignment of the third operation to a queue slot of the status bank. In some examples, the transmission component 525 may be configured as or otherwise support a means for transmitting the first command via an address channel or a data channel coupled with the first memory die, where the first command includes an association between the queue slot of the status bank and the first channel of the data bus.

The reception component 530 may be configured as or otherwise support a means for receiving, via a first channel of the data bus determined based at least in part on the assigned queue slot of the status bank, the status of the first operation based at least in part on transmitting the second command to the first memory die. In some examples, the reception component 530 may be configured as or otherwise support a means for receiving, via a second channel of the data bus determined based at least in part on the assigned second queue slot of the status bank, the status of the second operation based at least in part on transmitting the second command concurrently to the first memory die and the second memory die.

In some examples, the first command is configured to initiate the first operation on at least one plane of the first memory die, and the determination component 535 may be configured as or otherwise support a means for determining that the received status of the first operation is associated with the at least one plane of the first memory die based at least in part on the assigned queue slot of the status bank. In some examples, the determination component 535 may be configured as or otherwise support a means for determining that the received status of the first operation is associated with the at least one plane of the first memory die by identifying a mapping between the assigned queue slot of the status bank and the first memory die.

In some examples, the first memory die includes a plurality of queue slots of each of a plurality of status banks. In some examples, each queue slot of the plurality of queue slots of each of the plurality of status banks is associated with a respective channel of the data bus.

Figure 6:
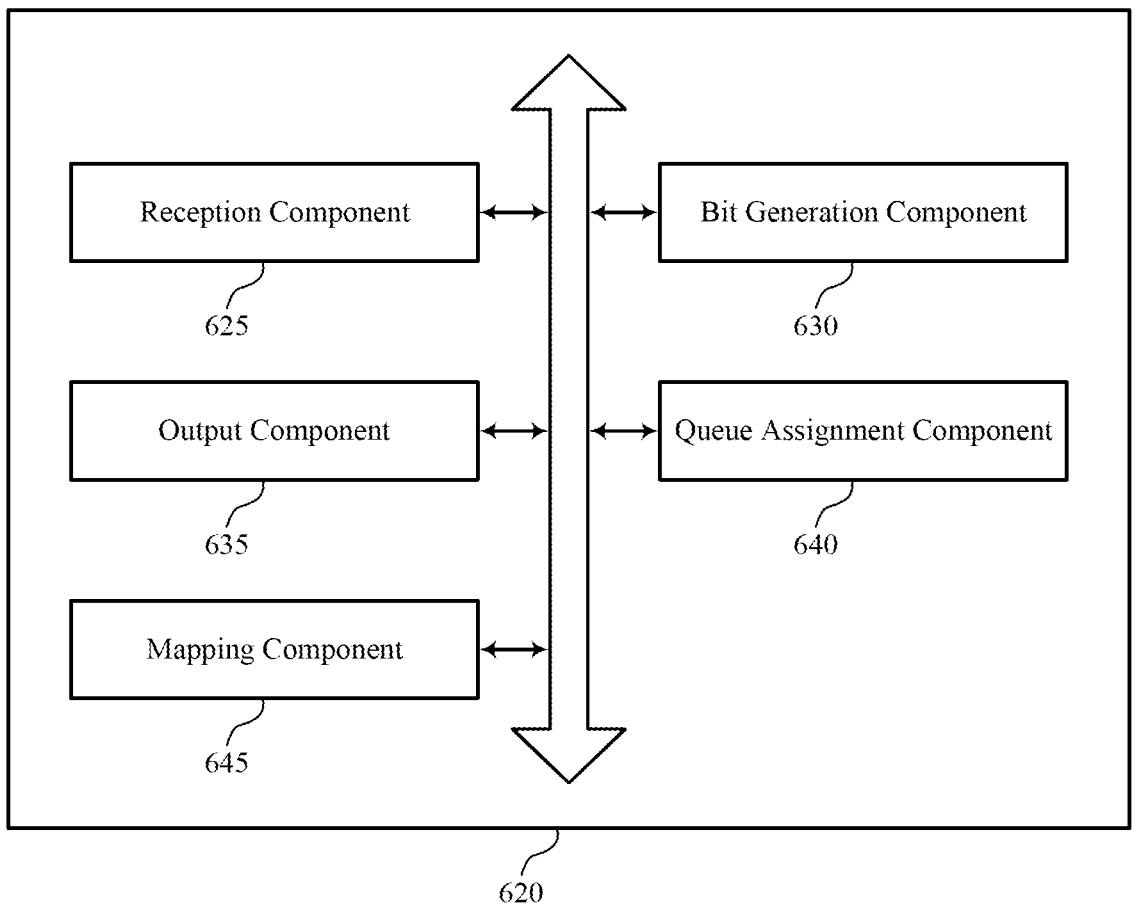
FIG. 6 shows a block diagram of a memory device that supports dynamic status registers array in accordance with examples as disclosed herein.

FIG. 6 shows a block diagram 600 of a memory device 620 that supports dynamic status registers array in accordance with examples as disclosed herein. The memory device 620 may be an example of aspects of a memory device as described with reference to FIGS. 1 through 4B. The memory device 620, or various components thereof, may be an example of means for performing various aspects of dynamic status registers array as described herein. For example, the memory device 620 may include a reception component 625, a bit generation component 630, an output component 635, a queue assignment component 640, a mapping component 645, or any combination thereof. Each of these components may communicate, directly or indirectly, with one another (e.g., via one or more buses).

The reception component 625 may be configured as or otherwise support a means for receiving a first command associated with a first operation on data, where the first command includes an assignment of the first operation to a queue slot of a status bank. In some examples, the reception component 625 may be configured as or otherwise support a means for receiving a second command requesting a status of the first operation based at least in part on receiving the first command, where the second command is associated with an output of status for the status bank on a data bus coupled with a plurality of devices, a device of the plurality of devices including the memory array and the controller.

In some examples, the reception component 625 may be configured as or otherwise support a means for receiving a third command associated with a second operation on the data, where the third command is associated with a third plane of the memory array, and where the first command includes an assignment of the second operation to a second queue slot of the status bank that is different than the queue slot.

The bit generation component 630 may be configured as or otherwise support a means for generating a bit indicating the status of the first operation performed on the memory array based at least in part on receiving the second command.

The output component 635 may be configured as or otherwise support a means for outputting the bit onto a first channel of the data bus based at least in part on generating the bit and an association between the assigned queue slot of the status bank and the first channel.

In some examples, the queue assignment component 640 may be configured as or otherwise support a means for assigning the queue slot to the first operation based at least in part on receiving the first command, where the first command is associated with a first plane of the memory array, where the generated bit indicates the status of the first operation performed on the first plane of the memory array, and the bit is output onto the first channel of the data bus based at least in part on assigning the queue slot to the first operation.

In some examples, the mapping component 645 may be configured as or otherwise support a means for storing a mapping between the assigned queue slot of the status bank and the first plane of the memory array that is associated with the first operation.

In some examples, a second channel of the data bus is associated with a concurrent output of a status associated with a second operation on a second plane of the memory array according to an assignment of the second operation with a second queue slot of the status bank associated with the second channel.

Figure 7:
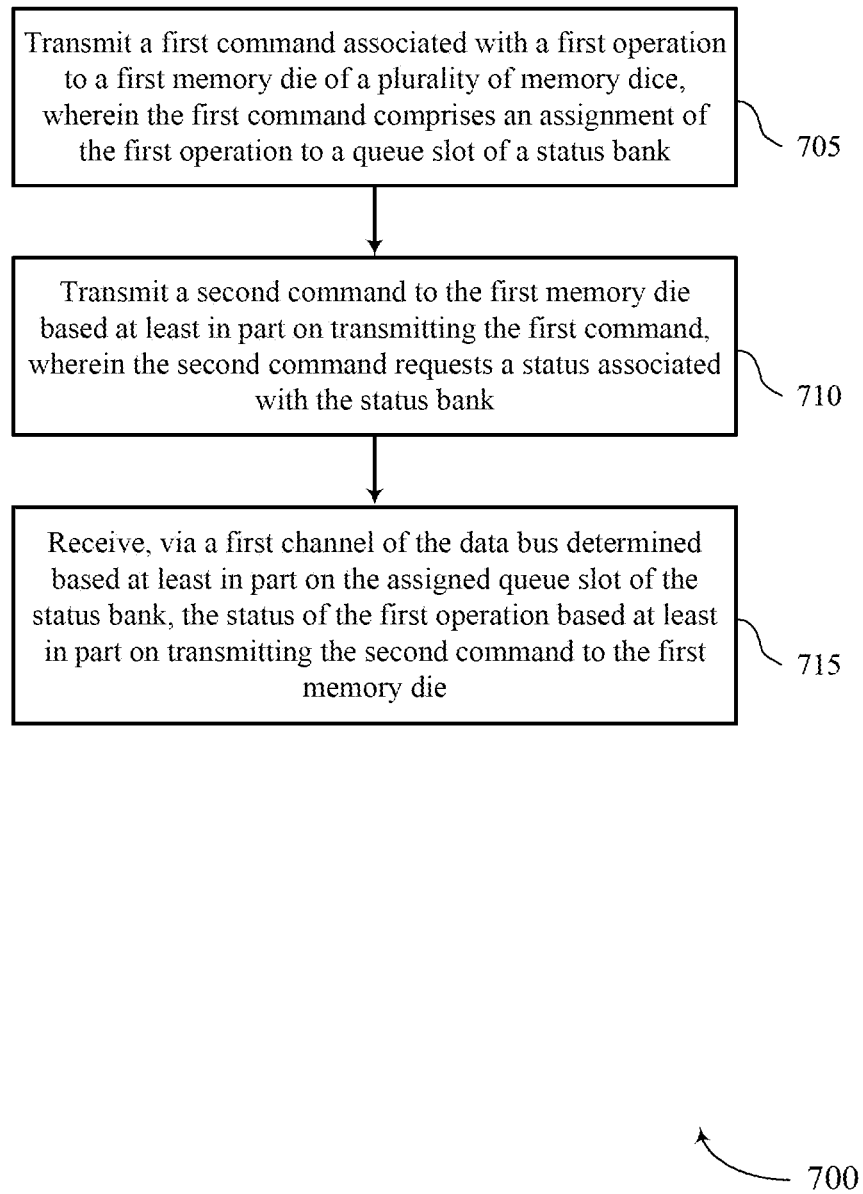
FIGS. 7 and 8 show flowcharts illustrating a method or methods that support dynamic status registers array in accordance with examples as disclosed herein.

FIG. 7 shows a flowchart illustrating a method 700 that supports dynamic status registers array in accordance with examples as disclosed herein. The operations of method 700 may be implemented by a memory system controller or its components as described herein. For example, the operations of method 700 may be performed by a memory system controller as described with reference to FIGS. 1 through 5. In some examples, a memory system controller may execute a set of instructions to control the functional elements of the device to perform the described functions. Additionally or alternatively, the memory system controller may perform aspects of the described functions using special-purpose hardware.

At 705, the method may include transmitting a first command associated with a first operation to a first memory die of a plurality of memory dice, where the first command includes an assignment of the first operation to a queue slot of a status bank. The operations of 705 may be performed in accordance with examples as disclosed herein. In some examples, aspects of the operations of 705 may be performed by a transmission component 525 as described with reference to FIG. 5.

At 710, the method may include transmitting a second command to the first memory die based at least in part on transmitting the first command, where the second command requests a status associated with the status bank. The operations of 710 may be performed in accordance with examples as disclosed herein. In some examples, aspects of the operations of 710 may be performed by a transmission component 525 as described with reference to FIG. 5.

At 715, the method may include receive, via a first channel of the data bus determined based at least in part on the assigned queue slot of the status bank, the status of the first operation based at least in part on transmitting the second command to the first memory die. The operations of 715 may be performed in accordance with examples as disclosed herein. In some examples, aspects of the operations of 715 may be performed by a reception component 530 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for transmitting a first command associated with a first operation to a first memory die of a plurality of memory dice, where the first command includes an assignment of the first operation to a queue slot of a status bank, transmitting a second command to the first memory die based at least in part on transmitting the first command, where the second command requests a status associated with the status bank, and receive, via a first channel of the data bus determined based at least in part on the assigned queue slot of the status bank, the status of the first operation based at least in part on transmitting the second command to the first memory die.

Some examples of the method 700 and the apparatus described herein may further include operations, features, circuitry, logic, means, or instructions for transmitting a third command associated with a second operation to a second memory die of the plurality of memory dice subsequent to transmitting the first command, where the third command includes an assignment of the second operation to a second queue slot of the status bank.

Some examples of the method 700 and the apparatus described herein may further include operations, features, circuitry, logic, means, or instructions for transmitting the second command concurrently to the first memory die and the second memory die based at least in part on transmitting the first command and the third command, where the second command may be further configured to request the status associated with the status bank from the second memory die and receiving, via a second channel of the data bus determined based at least in part on the assigned second queue slot of the status bank, the status of the second operation based at least in part on transmitting the second command concurrently to the first memory die and the second memory die.

In some examples of the method 700 and the apparatus described herein, and the method, apparatuses, and non-transitory computer-readable medium may include further operations, features, circuitry, logic, means, or instructions for transmitting a fourth command associated with a third operation to the first memory die of the plurality of memory dice based at least in part on receiving the indication of completion of the first operation, where the fourth command includes an assignment of the third operation to a queue slot of the status bank.

In some examples of the method 700 and the apparatus described herein, the first command may be configured to initiate the first operation on at least one plane of the first memory die and the method, apparatuses, and non-transitory computer-readable medium may include further operations, features, circuitry, logic, means, or instructions for determining that the received status of the first operation may be associated with the at least one plane of the first memory die based at least in part on the assigned queue slot of the status bank.

Some examples of the method 700 and the apparatus described herein may further include operations, features, circuitry, logic, means, or instructions for determining that the received status of the first operation may be associated with the at least one plane of the first memory die by identifying a mapping between the assigned queue slot of the status bank and the first memory die.

Some examples of the method 700 and the apparatus described herein may further include operations, features, circuitry, logic, means, or instructions for transmitting the first command via an address channel or a data channel coupled with the first memory die, where the first command includes an association between the queue slot of the status bank and the first channel of the data bus.

In some examples of the method 700 and the apparatus described herein, the first memory die includes a plurality of queue slots of each of a plurality of status banks, and each queue slot of the plurality of queue slots of each of the plurality of status banks may be associated with a respective channel of the data bus.

Figure 8:
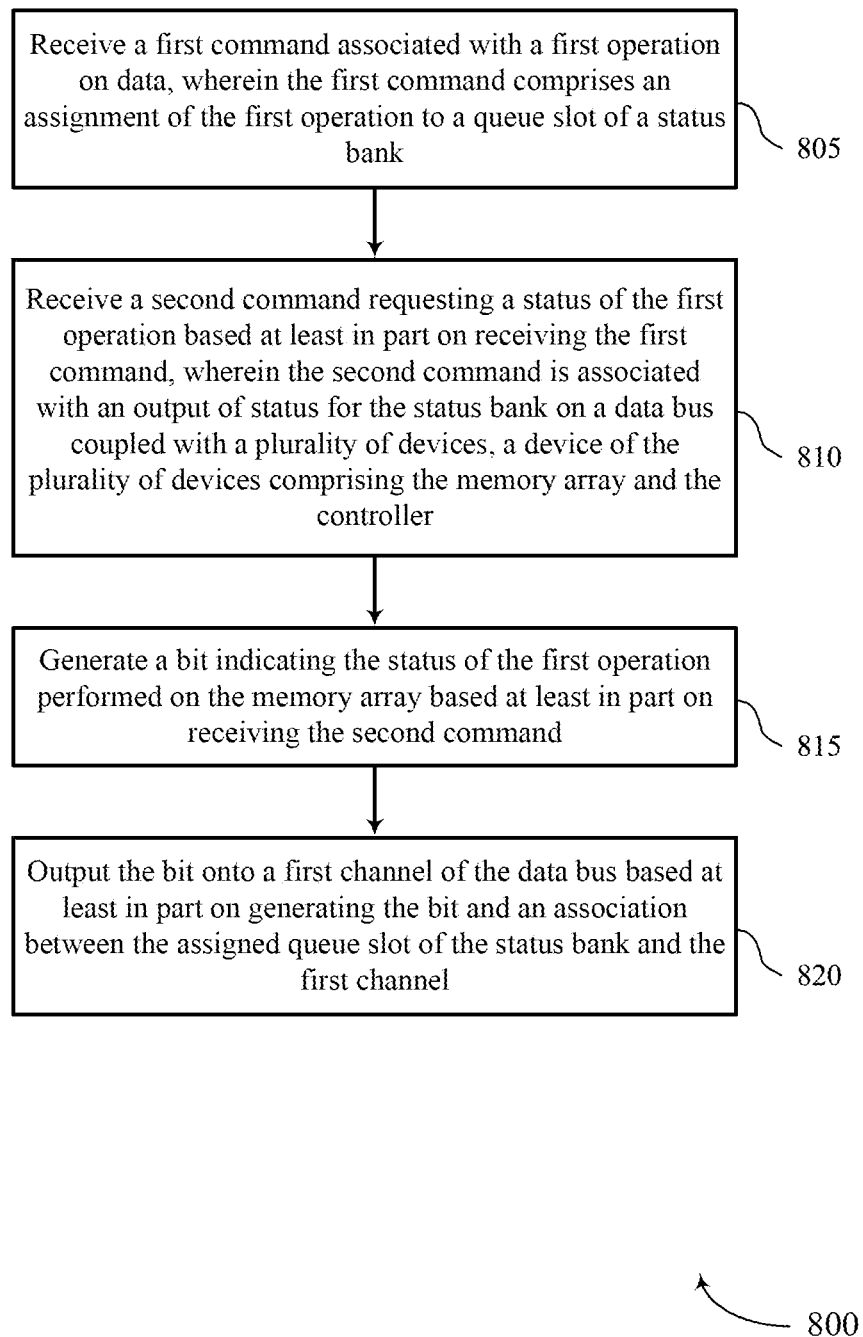

FIG. 8 shows a flowchart illustrating a method 800 that supports dynamic status registers array in accordance with examples as disclosed herein. The operations of method 800 may be implemented by a memory device or its components as described herein. For example, the operations of method 800 may be performed by a memory device as described with reference to FIGS. 1 through 4 and 6. In some examples, a memory device may execute a set of instructions to control the functional elements of the device to perform the described functions. Additionally or alternatively, the memory device may perform aspects of the described functions using special-purpose hardware.

At 805, the method may include receiving a first command associated with a first operation on data, where the first command includes an assignment of the first operation to a queue slot of a status bank. The operations of 805 may be performed in accordance with examples as disclosed herein. In some examples, aspects of the operations of 805 may be performed by a reception component 625 as described with reference to FIG. 6.

At 810, the method may include receiving a second command requesting a status of the first operation based at least in part on receiving the first command, where the second command is associated with an output of status for the status bank on a data bus coupled with a plurality of devices, a device of the plurality of devices including the memory array and the controller. The operations of 810 may be performed in accordance with examples as disclosed herein. In some examples, aspects of the operations of 810 may be performed by a reception component 625 as described with reference to FIG. 6.

At 815, the method may include generating a bit indicating the status of the first operation performed on the memory array based at least in part on receiving the second command. The operations of 815 may be performed in accordance with examples as disclosed herein. In some examples, aspects of the operations of 815 may be performed by a bit generation component 630 as described with reference to FIG. 6.

At 820, the method may include outputting the bit onto a first channel of the data bus based at least in part on generating the bit and an association between the assigned queue slot of the status bank and the first channel. The operations of 820 may be performed in accordance with examples as disclosed herein. In some examples, aspects of the operations of 820 may be performed by an output component 635 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving a first command associated with a first operation on data, where the first command includes an assignment of the first operation to a queue slot of a status bank, receiving a second command requesting a status of the first operation based at least in part on receiving the first command, where the second command is associated with an output of status for the status bank on a data bus coupled with a plurality of devices, a device of the plurality of devices including the memory array and the controller, generating a bit indicating the status of the first operation performed on the memory array based at least in part on receiving the second command, and outputting the bit onto a first channel of the data bus based at least in part on generating the bit and an association between the assigned queue slot of the status bank and the first channel.

Some examples of the method 800 and the apparatus described herein may further include operations, features, circuitry, logic, means, or instructions for assigning the queue slot to the first operation based at least in part on receiving the first command, where the first command may be associated with a first plane of the memory array, where the generated bit indicates the status of the first operation performed on the first plane of the memory array, and the bit may be output onto the first channel of the data bus based at least in part on assigning the queue slot to the first operation.

In some examples of the method 800 and the apparatus described herein, a second channel of the data bus may be associated with a concurrent output of a status associated with a second operation on a second plane of the memory array according to an assignment of the second operation with a second queue slot of the status bank associated with the second channel.

Some examples of the method 800 and the apparatus described herein may further include operations, features, circuitry, logic, means, or instructions for storing a mapping between the assigned queue slot of the status bank and the first plane of the memory array that may be associated with the first operation.

Some examples of the method 800 and the apparatus described herein may further include operations, features, circuitry, logic, means, or instructions for receiving a third command associated with a second operation on the data, where the third command may be associated with a third plane of the memory array, and where the first command includes an assignment of the second operation to a second queue slot of the status bank that may be different than the queue slot.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A memory system, comprising:
a plurality of memory devices;
a data bus coupled with each of the plurality of memory devices; and
processing circuitry coupled with at least some of the plurality of memory devices via the data bus, the processing circuitry configured to:
transmit a first command associated with a first operation to a first memory device of the plurality of memory devices, wherein the first command comprises an assignment of the first operation to a first queue slot of a status bank;
transmit a second command concurrently to the first memory device and a second memory device in response to transmitting the first command, wherein the second command requests a first status associated with the status bank from the first memory device and a second status associated with the status bank from the second memory device;
receive, from the first memory device via a first channel of the data bus determined in accordance with the assigned first queue slot of the status bank, the first status associated with the first memory device in response to transmitting the first command to the first memory device; and
receive, from the second memory device of the plurality of memory devices via a second channel of the data bus determined in accordance with a second queue slot of the status bank different than the first queue slot, the second status associated with the second memory device.

2. The memory system of claim 1, wherein the processing circuitry is further configured to:
transmit a third command associated with a second operation to the second memory device subsequent to transmitting the first command, wherein the third command comprises a second assignment of the second operation to the second queue slot of the status bank.

3. The memory system of claim 1, wherein transmitting the second command concurrently to the first memory device and the second memory device comprises:
transmitting a first chip enable signal associated with the first memory device concurrently with a second chip enable signal associated with the second memory device, wherein the first chip enable signal activates the first memory device and the second chip enable signal activates the second memory device.

4. The memory system of claim 1, wherein the first status associated with the first memory device comprises a first value indicating that the first memory device is ready to be serviced and the second status associated with the second memory device comprises a second value indicating that the second memory device is busy.

5. The memory system of claim 1, wherein receiving the first status associated with the first memory device comprises receiving an indication of completion of the first operation, wherein the processing circuitry is further configured to:
transmit a fourth command associated with a third operation to the first memory device in response to receiving the indication of the completion of the first operation, wherein the fourth command comprises a second assignment of the third operation to the first queue slot of the status bank.

6. The memory system of claim 1, wherein the first command is configured to initiate the first operation on at least one plane of the first memory device, wherein the processing circuitry is further configured to:
determine that the received first status associated with the first memory device is associated with the at least one plane of the first memory device in accordance with the assigned first queue slot of the status bank.

7. The memory system of claim 6, wherein the processing circuitry is further configured to:
determine that the received first status associated with the first memory device is associated with the at least one plane of the first memory device by identifying a mapping between the assigned first queue slot of the status bank and the first memory device.

8. The memory system of claim 1, wherein the processing circuitry is further configured to:
transmit the first command via an address channel or a data channel coupled with the first memory device, wherein the first command comprises an association between the first queue slot of the status bank and the first channel of the data bus.

9. A memory system, comprising:
a plurality of memory devices;
a data bus coupled with each of the plurality of memory devices; and
processing circuitry coupled with at least some of the plurality of memory devices via the data bus, the processing circuitry configured to:
transmit a first command associated with a first operation to a first memory device of the plurality of memory devices, wherein the first command comprises an assignment of the first operation to a first queue slot of a status bank. wherein the first memory device comprises a plurality of queue slots of each of a plurality of status banks, wherein each queue slot of the plurality of queue slots of each of the plurality of status banks is associated with a respective channel of the data bus;
receive, from the first memory device via a first channel of the data bus determined in accordance with the assigned first queue slot of the status bank, a first status associated with the first memory device in response to transmitting the first command to the first memory device; and
receive, from a second memory device of the plurality of memory devices via a second channel of the data bus determined in accordance with a second queue slot of the status bank different than the first queue slot, a second status associated with the second memory device.

10. A memory system, comprising:
one or more memory devices comprising a plurality of planes;
a data bus coupled with the one or more memory devices; and
processing circuitry coupled with the one or more memory devices via the data bus, the processing circuitry configured to:
transmit, to the one or more memory devices, a first command associated with a first operation corresponding to a first plane of the plurality of planes, wherein the first command comprises an assignment of the first operation to a queue slot of a status bank;
transmit, to the one or more memory devices, a second command in response to transmitting the first command, wherein the second command requests a status associated with the status bank;

receive, via a first channel of the data bus determined in accordance with the assigned queue slot of the status bank, the status of the first operation in response to transmitting the second command to the one or more memory devices, wherein receiving the status of the first operation comprises receiving an indication of completion of the first operation; and remove the assignment of the first operation to the queue slot of the status bank in response to the indication of the completion of the first operation.

11. The memory system of claim 10, wherein the processing circuitry is further configured to:

transmit a third command associated with a second operation corresponding to a second plane of the plurality of planes subsequent to transmitting the first command, wherein the third command comprises a second assignment of the second operation to a second queue slot of the status bank.

12. The memory system of claim 11, wherein the processing circuitry is further configured to:

receive, via a second channel of the data bus determined in accordance with the assigned second queue slot of the status bank, the status of the second operation in response to transmitting the second command.

13. The memory system of claim 10, wherein the processing circuitry is further configured to:

transmit a fourth command associated with a third operation corresponding to the first plane of the plurality of planes in response to receiving the indication of the completion of the first operation, wherein the fourth command comprises a second assignment of the third operation to the queue slot of the status bank.

14. The memory system of claim 10, wherein the processing circuitry is further configured to:

determine that the received status of the first operation corresponds to the first plane in accordance with the assigned queue slot of the status bank.

15. The memory system of claim 10, wherein the one or more memory devices comprises a plurality of queue slots of each of a plurality of status banks, wherein each queue slot of the plurality of queue slots of each of the plurality of status banks is associated with a respective channel of the data bus.

16. A memory system, comprising:

one or more memory devices comprising a plurality of planes;

a data bus coupled with the one or more memory devices; and processing circuitry coupled with the one or more memory devices via the data bus, the processing circuitry configured to:

transmit, to the one or more memory devices, a first command associated with a first operation corresponding to a first plane of the plurality of planes, wherein the first command comprises an assignment of the first operation to a queue slot of a status bank;

transmit, to the one or more memory devices, a second command in response to transmitting the first command, wherein the second command requests a status associated with the status bank;

receive, via a first channel of the data bus determined in accordance with the assigned queue slot of the status bank, the status of the first operation in response to transmitting the second command to the one or more memory devices;

store, at the memory system, a mapping that indicates respective associations between each plane of the plurality of planes and a respective queue slot of the status bank, each queue slot corresponding to a respective channel of the data bus; and determine that the received status of the first operation corresponds to the first plane in accordance with the assigned queue slot of the status bank, wherein determining that the received status of the first operation corresponds to the first plane is in accordance with the stored mapping.

17. The memory system of claim 16, wherein the stored mapping indicates that the first plane corresponds to a first memory die of the one or more memory devices and that a second plane of the plurality of planes corresponds to a second memory die of the one or more memory devices.

18. A non-transitory computer-readable medium storing code comprising instructions which, when executed by a processor of a memory system, cause the memory system to:

transmit a first command associated with a first operation to a first memory device of a plurality of memory devices of the memory system, wherein the first command comprises an assignment of the first operation to a first queue slot of a status bank;

transmit a second command concurrently to the first memory device and a second memory device in response to transmitting the first command, wherein the second command requests a first status associated with the status bank from the first memory device and a second status associated with the status bank from the second memory device;

receive, from the first memory device via a first channel of a data bus determined in accordance with the assigned first queue slot of the status bank, the first status associated with the first memory device in response to transmitting the first command to the first memory device; and receive, from the second memory device of the plurality of memory devices via a second channel of the data bus determined in accordance with a second queue slot of the status bank different than the first queue slot, the second status associated with the second memory device.

* * * * *